(12) United States Patent
Saito

(10) Patent No.: US 9,218,870 B2
(45) Date of Patent: Dec. 22, 2015

(54) SEMICONDUCTOR MEMORY DEVICE

(71) Applicant: Semiconductor Energy Laboratory Co., Ltd., Atsugi-shi, Kanagawa-ken (JP)

(72) Inventor: Toshihiko Saito, Kanagawa (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 0 days.

(21) Appl. No.: 14/505,551

(22) Filed: Oct. 3, 2014

(65) Prior Publication Data
US 2015/0023090 A1    Jan. 22, 2015

Related U.S. Application Data

(63) Continuation of application No. 13/298,235, filed on Nov. 16, 2011, now Pat. No. 8,854,865.

(30) Foreign Application Priority Data

Nov. 24, 2010 (JP) .................. 2010-261470

(51) Int. Cl.
*G11C 11/24* (2006.01)
*G11C 11/401* (2006.01)
(Continued)

(52) U.S. Cl.
CPC ............ *G11C 11/401* (2013.01); *G11C 11/404* (2013.01); *H01L 21/84* (2013.01); *H01L 27/108* (2013.01); *H01L 27/1203* (2013.01);
(Continued)

(58) Field of Classification Search
CPC .... G11C 11/24; G11C 11/406; H01L 27/108; H01L 28/40; H01L 28/60
USPC ........................................ 365/149
See application file for complete search history.

(56) References Cited

U.S. PATENT DOCUMENTS 5,307,304 A    4/1994  Saito et al.
5,525,820 A *  6/1996  Furuyama .................. 257/296
(Continued)

FOREIGN PATENT DOCUMENTS

CN    101447398 A    6/2009
EP    0469934 A      2/1992
(Continued)

OTHER PUBLICATIONS

Kim.W et al., "An Experimental High-Density DRAM Cell with a Built-in Gain Stage". IEEE Journal of Solid-State Circuits, Aug. 1, 1994, vol. 29, No. 8, pp. 978-981.

(Continued)

*Primary Examiner* — Son Dinh
*Assistant Examiner* — Uyen B Tran
(74) *Attorney, Agent, or Firm* — Fish & Richardson P.C.

(57) ABSTRACT

To increase a storage capacity of a memory module per unit area, and to provide a memory module with low power consumption, a transistor formed using an oxide semiconductor film, a silicon carbide film, a gallium nitride film, or the like, which is highly purified and has a wide band gap of 2.5 eV or higher is used for a DRAM, so that a retention period of potentials in a capacitor can be extended. Further, a memory cell has n capacitors with different capacitances and the n capacitors are each connected to a corresponding one of n data lines, so that a variety of the storage capacitances can be obtained and multilevel data can be stored. The capacitors may be stacked for reducing the area of the memory cell.

20 Claims, 8 Drawing Sheets

(51) Int. Cl.
   *G11C 11/404*  (2006.01)
   *H01L 21/84*   (2006.01)
   *H01L 27/108*  (2006.01)
   *H01L 27/12*   (2006.01)
   *H01L 49/02*   (2006.01)

(52) U.S. Cl.
   CPC ............ *H01L28/40* (2013.01); *H01L 28/60* (2013.01); *H01L 27/1085* (2013.01); *H01L 27/10852* (2013.01); *H01L 27/10873* (2013.01)

(56) References Cited

U.S. PATENT DOCUMENTS

| | | |
|---|---|---|
| 5,731,856 A | 3/1998 | Kim et al. |
| 5,744,864 A | 4/1998 | Cillessen et al. |
| 6,127,702 A | 10/2000 | Yamazaki et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,605,410 B2 | 10/2009 | Takano et al. |
| 7,674,650 B2 | 3/2010 | Akimoto et al. |
| 7,732,819 B2 | 6/2010 | Akimoto et al. |
| 8,036,020 B2 | 10/2011 | La Rosa |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0127380 A1 | 6/2005 | Kawasaki et al. |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0289917 A1* | 12/2006 | Fujiwara et al. ............. 257/296 |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0158137 A1 | 7/2008 | Yoshida |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0038618 A1 | 2/2010 | Takano et al. |
| 2010/0054024 A1 | 3/2010 | La Rosa |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0117684 A1 | 5/2010 | Kim et al. |
| 2010/0148171 A1 | 6/2010 | Hayashi et al. |
| 2010/0155799 A1 | 6/2010 | Yokoyama |
| 2010/0295042 A1* | 11/2010 | Yano et al. ...................... 257/43 |
| 2011/0076790 A1 | 3/2011 | Ofuji et al. |
| 2011/0156027 A1 | 6/2011 | Yamazaki et al. |
| 2011/0156117 A1 | 6/2011 | Yamazaki et al. |
| 2012/0106226 A1 | 5/2012 | Saito |

FOREIGN PATENT DOCUMENTS

| | | |
|---|---|---|
| EP | 1134811 A | 9/2001 |
| EP | 1737044 A | 12/2006 |
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 04-090189 A | 3/1992 |
| JP | 05-251705 A | 9/1993 |
| JP | 06-295589 A | 10/1994 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-026283 A | 1/2002 |
| JP | 2002-076356 A | 3/2002 |
| JP | 2002-289859 A | 10/2002 |
| JP | 2002-368226 A | 12/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |

(56) References Cited

FOREIGN PATENT DOCUMENTS

| JP | 2005-050403 A | 2/2005 |
| JP | 2009-277702 A | 11/2009 |
| JP | 2009-544962 | 12/2009 |
| JP | 2010-147392 A | 7/2010 |
| WO | WO-00/30183 | 5/2000 |
| WO | WO-2004/114391 | 12/2004 |
| WO | WO-2008/012462 | 1/2008 |
| WO | WO-2009/139482 | 11/2009 |

OTHER PUBLICATIONS

Shukuri.S et al., "A Complementary Gain Cell Technology for sub-1 V Supply DRAMs", IEDM 92: Technical Digest of International Electron Devices Meeting, Dec. 13, 1992, pp. 1006-1008.

Ishii.T et al., "A Poly-Silicon TFT With a Sub-5-nm Thick Channel for Low-Power Gain Cell Memory in Mobile Applications", IEEE Transactions on Electron Devices, Nov. 1, 2004, vol. 51, No. 11, pp. 1805-1810.

Shukuri.S et al., "A Semi-Static Complementary Gain Cell Technology for Sub-1 V Supply DRAM's", IEEE Transactions on Electron Devices, Jun. 1, 1994, vol. 41, No. 6, pp. 926-931.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:AL and SN-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using Castep", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1. pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39. pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al.. "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS. Eng.

Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,Or Zn] at Temperatures Over 1000° C.", Journal of Solid State Chemistry, 1985, vol. 60, pp. 382-384.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14. No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED ", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

(56) References Cited

OTHER PUBLICATIONS

Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18. pp. 1216-1219.

Miyasaka.M, "Suftla Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn—Oxide TFTs With a Novel Passivation Layer", SID Digest '09 : SID International Symposium Digest of Technical Papers, May 31, 2009, pp. 284-287.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al.. "Mechanism of Electrical Conductivity of Transparent InGaZnO4". Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Park.J et al., "Amorphous Indium—Gallium—Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium—Gallium—Zinc Oxide Semiconductor Upon Exposure to Water", Appl. Phys. Lett. (Applied Physics Letters) , 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Park.S at al., "Challenge to Future Displays: Transparent AM-OLED Driven by Peald Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Sakata.J et al., "Development of 4.0-In. AMOLED Display With Driver Circuit Using Amorphous In—Ga—Zn—Oxide TFTs", IDW '09 : Proceedings of the 16TH International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor". IDW '08 : Proceedings of the 15th International Display Workshops, Dec. 3, 2008, pp. 1637-1640.

Tsuda.K at al., "Ultra Low Power Consumption Technologies for Mobile TFT-LCDs", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Taiwanese Office Action (Application No. 100142543) Dated Sep. 22, 2015.

Taiwanese Office Action (Application No. 103141784) Dated Sep. 14, 2015.

* cited by examiner

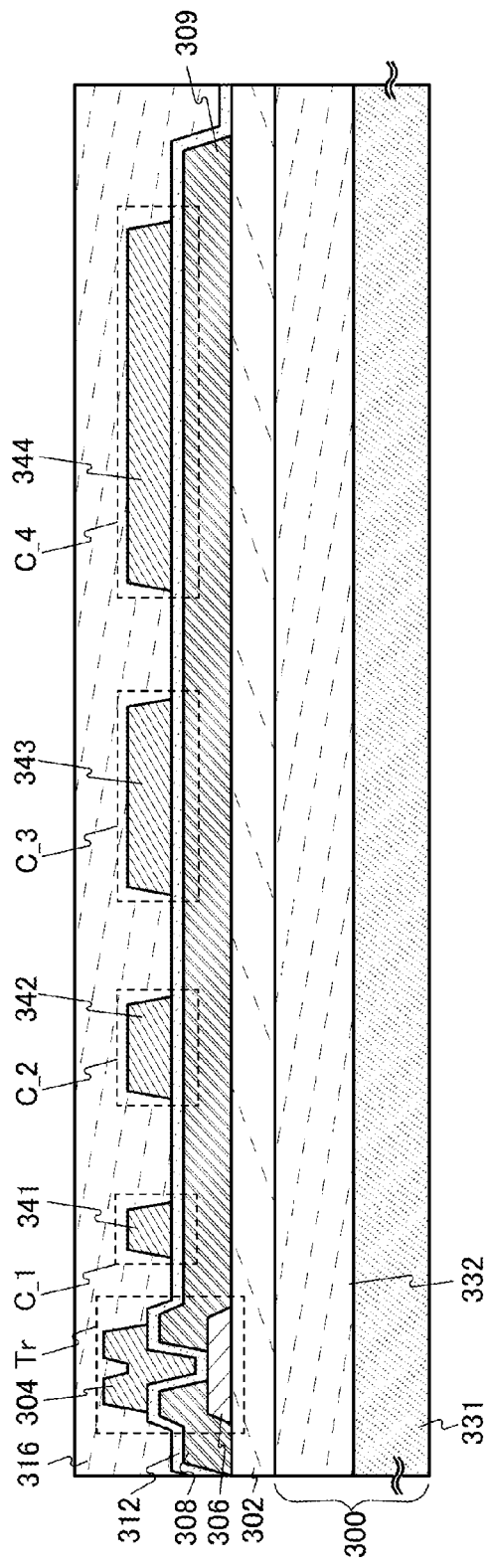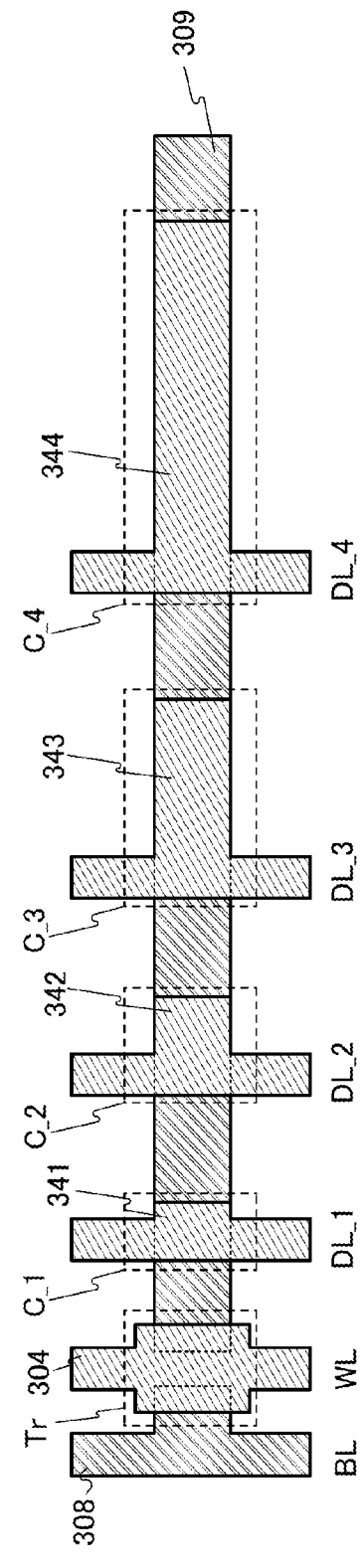

SEMICONDUCTOR MEMORY DEVICE

CROSS-REFERENCE TO RELATED APPLICATIONS

This application is a continuation of U.S. application Ser. No. 13/298,235, filed Nov. 16, 2011, now allowed, which claims the benefit of a foreign priority application filed in Japan as Serial No. 2010-261470 on Nov. 24, 2010, both of which are incorporated by reference.

BACKGROUND OF THE INVENTION

1. Field of the Invention

The present invention relates to semiconductor memory devices.

2. Description of the Related Art

A dynamic random access memory (DRAM) is a semiconductor memory device where one bit of data can be stored with use of one transistor and one capacitor. The DRAM has a small area per memory cell, easiness in integration for modularization, and is manufactured at low cost.

In a DRAM, electric charges stored in a capacitor are leaked due to off-state current of a transistor, and thus an operation of recharge (refresh) is required before charges are lost.

REFERENCE

[Patent Document 1] Japanese Published Patent Application No. H6-295589

SUMMARY OF THE INVENTION

A DRAM will be explained with reference to a circuit diagram of FIG. 8A. A DRAM includes a bit line BL, a word line WL, a sense amplifier SAmp, a transistor Tr, and a capacitor C.

It is known that the potential stored in the capacitor is reduced with time as shown in FIG. 8B. The potential charged from V0 to V1 is reduced with time, to VA that is a limit for reading out data 1. This period is a retention period T_1. Namely, in the case of a two-level memory cell, a refresh operation is required during the retention period T_1.

On the other hand, there is a limit on the increase of a storage capacitance of a memory module per unit area only by downsizing a memory cell, and a multilevel technique with which one memory cell contains a plurality of data is desired.

A three-level memory cell from which data 1 and data 2 can be read is described. In FIG. 8C, the limit for reading out data 2 is V1, and the period is a retention period T_2. As shown in FIG. 8C, it is found that the retention period T_2 is shorter than the retention period T_1 of the two-level memory cell. Therefore, the refresh operation is required to perform more frequently. However, it is difficult to realize a multilevel memory cell in consideration of margin of reading.

In the invention disclosed in Patent Document 1, one transistor and a plurality of capacitors are included in one memory cell, and one side of each of the plurality of capacitors is electrically connected to a source or a drain of the transistor, and the other sides thereof serves as a plate electrode independently. With the combination of potentials applied to the plate electrodes at the time of writing, a plurality of values are memorized in the memory cell.

However, the invention has the following problematic points: (1) the period until when a refresh operation is needed is short, and the refresh operation is repeated many times per unit time (which leads to consumption of a large amount of current), and (2) it is difficult to store more levels of data.

The point (1) results from the use of a transistor having a channel formed in a semiconductor substrate of silicon in a memory cell. A slight amount of current flows even in an off-state transistor; in the case of such a transistor having a channel in a semiconductor substrate of silicon, a leakage current in an off-state is about 1 nA. When a 1-fF-storage capacitor is used, the retention period is about several microseconds, and thus the extremely frequent refresh operation need be performed to hold data.

As for the point (2), in the example in Patent Document 1, although four separate capacitors are used, data cannot be distinguished for each capacitor, and thus only four levels of data (or nine levels even when negative potentials are used at the time of writing) can be stored, which is inefficient.

In view of the above, it is an object of one embodiment of the present invention to increase a storage capacity of a memory module per unit area.

Further, it is another object of one embodiment of the present invention to provide a memory module with small power consumption.

By adopting a multilevel and stacked-layer capacitor, the storage capacity of a memory module per unit area is increased.

One embodiment of the present invention is a semiconductor memory device comprising: a bit line; a word line; n (n is a natural number of 2 or more) data lines; a memory cell including a transistor having a channel formed in an oxide semiconductor film and n capacitors with different capacitances, wherein one of a source and a drain of the transistor is connected to the bit line, and the other of the source and the drain of the transistor is connected to one electrode of each of the n capacitors, a gate of the transistor is connected to the word line, and each of the other electrodes of the n capacitors is connected to a corresponding of the n data lines.

The loss of electric charges from a capacitor is caused by off-state current of a transistor. The off-state current means a current flowing between a source and a drain when the transistor is in an off-state. Since the off-state current flows, electric charges stored in a capacitor are lost with time. In order to avoid such a phenomenon, with use of a transistor with a small off-state current, the retention period of potentials in the capacitor can be extended.

The off-state current of a transistor is caused by recombination of carriers in a semiconductor film. Therefore, as the band gap of a semiconductor film is larger and/or as the amount of an impurity serving as a recombination center of carriers is smaller, the off-state current hardly flows. For example, for a transistor, one of an oxide semiconductor film, a silicon carbide film, and a gallium nitride film which are highly purified and have a band gap of 2.5 eV or higher may be used. Note that a transistor using a silicon carbide film or a gallium nitride film is often a depletion-type, and thus its threshold is difficult to control. For that reason, in this specification, transistors using oxide semiconductor films are described, because enhancement-type transistors using oxide semiconductors have been reported and known.

In particular, an oxide semiconductor film can be easily formed with a sputtering apparatus or the like, and a transistor using such an oxide semiconductor film exhibits a small amount of off-state current; therefore, such an oxide semiconductor film is a suitable material for carrying out the present invention. For example, the off-state current of a transistor using an oxide semiconductor film of In—Ga—Zn—O is $1 \times 10^{-18}$ A or lower, the off-state current of a transistor using a highly-purified oxide semiconductor film of In—Ga—Zn—O is $1\times10^{-21}$ A or lower, and when the concentration of an impurity is lowered, the off-state current becomes extremely low, $1\times10^{-24}$ A or lower. This value is actually $1/10^{14}$ to $1/10^8$ of the off-state current of a transistor having a channel in a semiconductor substrate of silicon, and a retention period of charges in a capacitor is $10^8$-fold to $10^{14}$-fold.

As described above, a transistor with a small amount of off-state current is used, and thereby electric charges in a capacitor can be held long without an increase in the frequency of a refresh operation.

In addition, the reduced frequency of the refresh operation leads to low power consumption.

Further, since the loss of electric charges hardly occurs, comparison in a slight difference between capacitances can be performed and such capacitors can be downsized, memory cells are also downsized, and thereby a memory module can be downsized or highly integrated.

Furthermore, a memory cell includes n capacitors with different capacitances, different n data lines are connected to the n capacitors respectively, so that a variety of combinations of storage capacitances in the entire memory cell can be obtained. By reading the potential in accordance with the storage capacitance, a multilevel memory cell can be realized.

For example, the capacitance of a first capacitor is 1, the capacitance of a second capacitor is 2, and the capacitance of a k (k is a natural number of n or less)-th capacitor is $2^{k-1}$. When the number of capacitors in a memory cell is n, the number of the combination of potentials held in the memory cell is $2^n$. In other words, a $2^n$-level memory cell can be obtained.

In addition, in accordance with one embodiment of the present invention, capacitors can be stacked. When capacitors are stacked, a small-area memory cell can be formed, and thus the storage capacity of a memory module per unit area can be more increased.

Alternatively, memory cells may be stacked. With memory cells stacked, the storage capacitance of a memory module per unit area can be much more increased.

A multilevel and stacked-layer memory cell is employed, and thereby the storage capacity of a memory module per unit area can be increased.

Further, the frequency of a refresh operation in a memory cell is reduced, and thereby the power consumption of a memory module can be reduced.

BRIEF DESCRIPTION OF THE DRAWINGS

In the accompanying drawings:

FIGS. 3A and 3B are a cross-sectional view and a top view of a memory cell in a semiconductor memory device, respectively;

DETAILED DESCRIPTION OF THE INVENTION

Figure 1A:
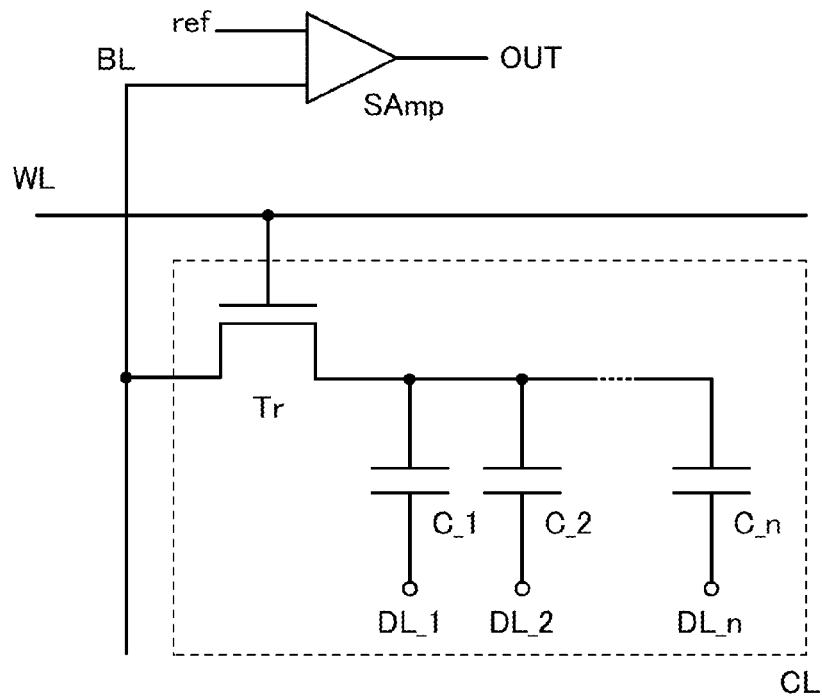
FIGS. 1A and 1B are circuit diagrams illustrating examples of semiconductor memory devices.

Hereinafter, embodiments of the present invention will be described in detail with reference to the accompanying drawings. However, the present invention is not limited to the following description, and it is easily understood by those skilled in the art that modes and details disclosed herein can be modified in various ways. Therefore, the present invention is not construed as being limited to description of the embodiments. In description of the structures of the present invention with reference to the drawings, the same reference numerals are used in common for the same portions in different drawings. Note that the same hatch pattern is applied to similar parts, and the similar parts are not especially denoted by reference numerals in some cases.

Note that the ordinal numbers such as "first" and "second" in this specification are used for convenience and do not denote the order of steps or the stacking order of layers. In addition, the ordinal numbers in this specification do not denote particular names which specify the present invention.

Before the description of the present invention, the terms used in this specification will be briefly explained. In this specification, one of a source and a drain of a transistor is called a drain while the other is called a source in this specification. That is, the source and the drain are not distinguished depending on the potential level. Therefore, in this specification, a portion called a source can be alternatively referred to as a drain.

Note that voltage refers to a potential difference between a certain potential and a reference potential (e.g., a ground potential) in many cases. Accordingly, voltage, potential and a potential difference can be referred to as potential, voltage, and a voltage difference, respectively.

Further, in this specification, even when the phrase "A is connected to B" is used, there is a case in which no physical connection between A and B is made in an actual circuit and a wiring is just extended between A and B. For example, in the case of a circuit including an insulated-gate field-effect transistor (MISFET), one wiring functions as gates of a plurality of MISFETs in some cases. In that case, one wiring which branches into gates may be illustrated in a circuit diagram. Even in such a case, the expression "a wiring is connected to a gate" may be used in this specification.

Note that in this specification, in referring to a specific row, a specific column, or a specific position in a matrix, a reference sign is accompanied by a sign denoting coordinates as follows, for example: "a transistor Tr_a_b", or "a bit line BL_b". In the case where a row, a column, or a position is not specified, the case where elements are collectively referred to, or the case where the position is obvious, the following expressions may be used: "a transistor Tr" and "a bit line BL", or simply "a transistor" and "a bit line".

Embodiment 1

In this embodiment, examples of a structure and an operation of a memory cell that is one of semiconductor memory devices will be described with reference to FIGS. 1A and 1B.

Figure 1B:
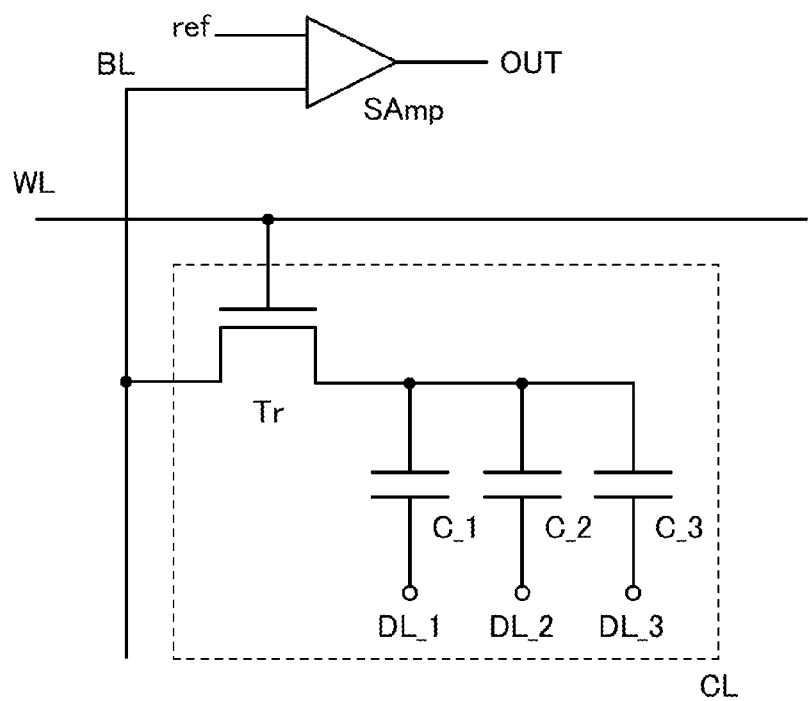

FIG. 1A is a circuit diagram illustrating a $2^n$-level memory cell which includes a bit line BL; a word line WL; data lines DL_1 to DL_n; a memory cell CL having a transistor Tr and capacitors C_1 to C_n; and a sense amplifier SAmp.

A gate of the transistor Tr is connected to the word line WL, one of a source and a drain of the transistor Tr is connected to the bit line BL, the other thereof is connected to one side of each of the capacitors C_1 to C_n, and the other sides of the capacitors C_1 to C_n are connected to the data lines DL_1 to DL_n. For example, the capacitor C_1, the capacitor C_2, and the capacitor C_n are connected to the data line DL_1, the data line DL_2, and the data line DL_n, respectively. The bit line BL is connected to the sense amplifier SAmp.

As the transistor Tr, a transistor with a small amount of off-state current is used. Specifically, for example, a highly-purified oxide semiconductor film having a wide band gap of 2.5 eV or higher may be used for an active layer of the transistor. Due to a wider band gap and fewer recombination centers of carriers, the amount of the off-state current of the transistor can be small.

The transistor with a small amount of off-state current is used for a memory cell, and thus the loss of electric charges stored in a capacitor can be inhibited. Therefore, the retention period of electric charges is extended, and the frequency of the refresh operation can be reduced, which can lead to reduction of power consumption. In addition, the inhabitation of the loss of electric charges makes it possible to decrease the capacitance of a capacitor and downsize of the memory cell, as compared with a conventional memory cell in a DRAM.

Further, the capacitance of each capacitor is adjusted, so that a plurality of amounts of electric charges held in the memory cell can be provided. That is, a multilevel memory cell can be formed.

For example, the capacitance of the capacitor C_k (k is a natural number of n or less) is $2^{k-1}$ fold of the capacitance of the capacitor C_1, so that the number of the combination of electric charges held can be $2^n$. Note that in accordance with the number of n, the area of a capacitor should be enlarged or a capacitor insulating film should be thinned. For that reason, depending on the number of n, there is a disadvantage in downsizing. In addition, when the amount of electric charges held is small, reading of potentials is difficult in some cases; therefore, n is preferably set in an appropriate range. For example, n is 2 to 8, preferably 3 to 5.

Note that the capacitance of the capacitor C_1 having the smallest capacitance may range from 0.1 fF to 1 fF. With use of an oxide semiconductor film for a transistor in a memory cell, even the above-described capacitor with a small capacitance can hold electric charges for a long period.

For example, with reference to FIG. 1B, a writing method under conditions where n is 3, the capacitance of the capacitor C_1 is 1 fF, the capacitance of the capacitor C_2 is 2 fF, and the capacitance of the capacitor C_3 is 4 fF will be described.

Writing on the capacitor C_1 to C_3 can be conducted independently. For example, the bit line is set to a predetermined potential VDD (a potential ample to charge the capacitor), and VH is applied to the word line. At this time, potentials of the data lines DL_1 to DL_3 may be controlled. The capacitor connected to the data line having a potential of VDD is not charged, while the capacitor connected to the data line having a capacitance of a ground potential, GND (reference potential), is charged to hold electric charges depending on the capacitance. In this specification, VH is a voltage having a potential higher than the voltage that is obtained by adding VDD to a threshold voltage (Vth) of the transistor. Table 1 shows the combination of the voltages and the potentials of the bit line (BL), the word line (WL), and the data lines (DL_1 to DL_3), and the storage capacitances (SC).

TABLE 1

| BL | WL | DL_1 | DL_2 | DL_3 | SC [fF] |
|----|----|------|------|------|---------|
| VDD | VH | GND | GND | GND | 7 |
| VDD | VH | VDD | GND | GND | 6 |
| VDD | VH | GND | VDD | GND | 5 |
| VDD | VH | VDD | VDD | GND | 4 |
| VDD | VH | GND | GND | VDD | 3 |
| VDD | VH | VDD | GND | VDD | 2 |
| VDD | VH | GND | VDD | VDD | 1 |
| VDD | VH | VDD | VDD | VDD | 0 |

As shown in Table 1, when n is 3, a 3-bit (8 levels) writing can be performed. The case where n is 3 is only shown in the table; the same can be applied to a case where n is more than 3. In other words, in accordance with one embodiment of the present invention, writing can be performed with the combination of $2^n$.

The potential of the memory cell CL can be held under the conditions where the potential of the bit line BL is a floating potential (float), the potential of the word line WL is GND or less than a threshold voltage, and the potentials of the data lines DL_1 to DL_3 are GND.

Next, a reading method will be described.

At the time of reading, the potentials of the data lines DL_1 to DL_3 are set at GND and the potential of the bit line BL is set at an appropriate potential, e.g., VR. Next, the potential of the word line WL is set at VH, so that the potential of the bit line BL is shifted to data_CL in accordance with the held potential. Here, the data_CL can be expressed in Equation 1.

$$\text{data\_CL} = \frac{VR \cdot C\_BL + VDD \cdot (f(1) \cdot C\_1 + f(2) \cdot C\_2 + f(3) \cdot C\_3)}{C\_BL + C\_1 + C\_2 + C\_3} \quad \text{[Equation 1]}$$

In Equation 1, C_BL represents a capacitance of the bit line BL. The f(1) to f(3) correspond to electric charges held in the capacitors C_1 to C_3, respectively. When electric charges are held in the capacitors C_1 to C_3, "1" is given to the f(1) to f(3), whereas when electric charges are not held in the capacitors C_1 to C_3, "0" is given to the f(1) to f(3).

By detecting data_CL with use of the sense amplifier SAmp, 3 bits (8 levels) of data can be read. The case where n is 3 is only described here; the same can be applied to a case where n is more than 3. In other words, in accordance with one embodiment of the present invention, reading can be performed with the combination of $2^n$. In that case, Equation 2 can be obtained as expansion of Equation 1.

$$\text{data\_CL} = \frac{VR \cdot C\_BL + VDD \cdot (f(1) \cdot C\_1 + f(2) \cdot C\_2 + \ldots + f(n) \cdot C\_n)}{C\_BL + C\_1 + C\_2 + \ldots + C\_n} \quad \text{[Equation 2]}$$

In Equation 2, the f(n) corresponds to electric charges held in the capacitor C_n. When electric charges are held in the capacitor, "1" is given to the f(n), whereas when electric charges are not held in the capacitor, "0" is given to the f(n).

In a conventional transistor having a channel in a semiconductor substrate of silicon, a large amount of off-state current flows and thus the potential cannot be held; therefore, a multilevel memory cell is difficult to obtain. In contrast, when a transistor with a small amount of off-state current is used and a plurality of capacitors and capacitor wirings connected to the plurality of capacitors are provided, a $2^n$-level memory cell can be realized.

This embodiment can be combined with any of the other embodiments as appropriate

Embodiment 2

In this embodiment, a memory module having a rows and b columns using the memory cells described in Embodiment 1 will be described with reference to FIG. 2, as one example of semiconductor memory devices.

Figure 2:
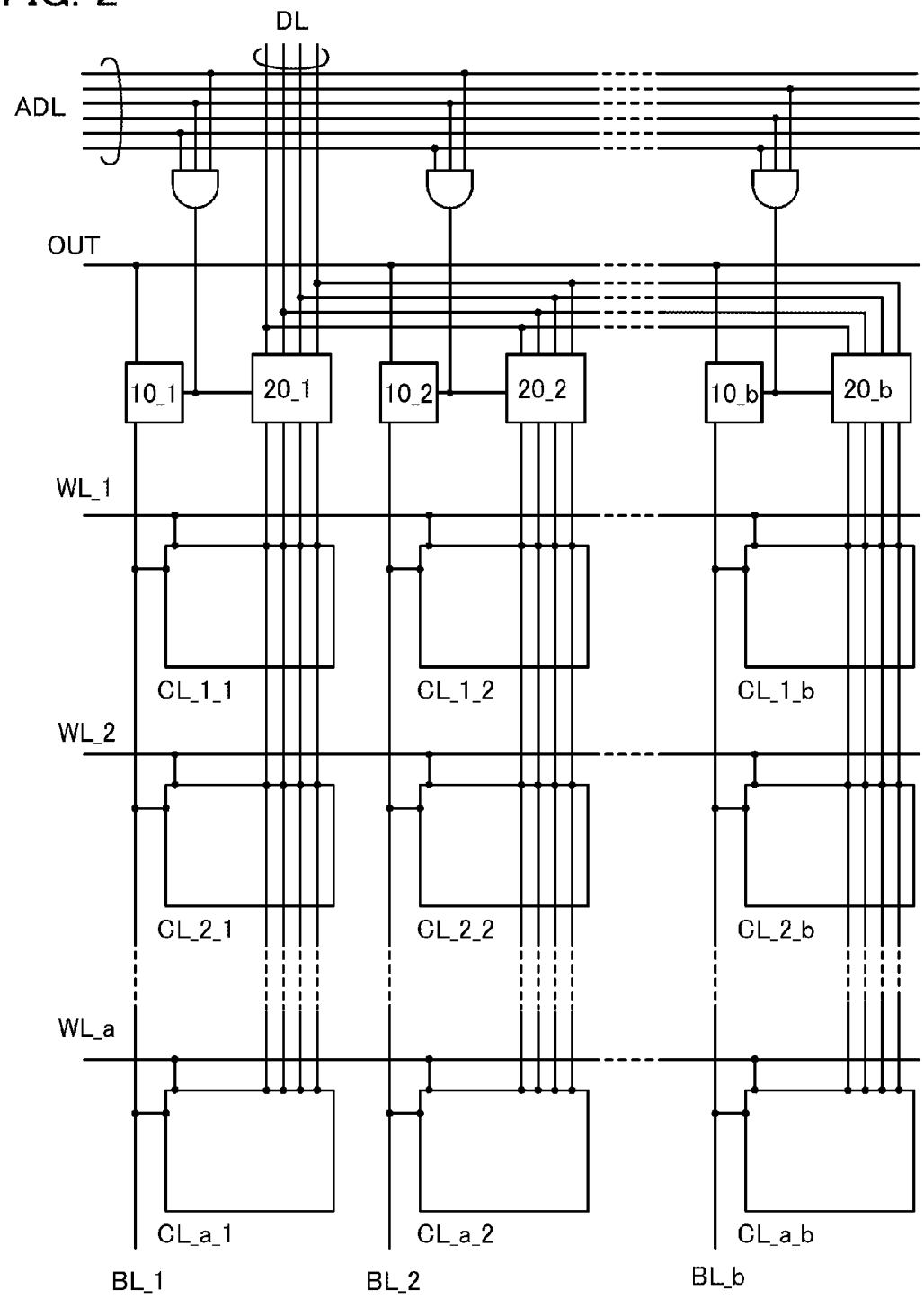
FIG. 2 is a circuit diagram illustrating an example of modularizing a semiconductor memory device.

FIG. 2 illustrates a memory module including an address line ADL, a data line DL, bit lines BL_1 to BL_b, word lines WL_1 to WL_a, AND circuits, an output OUT, reading circuits 10_1 to 10_b, switching circuits 20_1 to 20_b, and memory cells CL_1_1 to CL_a_b.

The address lines ADL are connected to the reading circuits 10_1 to 10_b and the switch circuits 20_1 to 20_b via AND circuits. The data lines DL are each connected to a corresponding capacitor in the memory cells CL_1_1 to CL_a_b via the switch circuits 20_1 to 20_b. The bit line BL_1 is connected to one of a source and a drain of a transistor in each of the memory cells CL_1_1 to CL_a_1 and to the output OUT via the reading circuit 10_1. Similarly, the bit line BL_2 and BL_b are connected to one of a source and a drain of a transistor in each of the memory cells CL_1_2 to CL_a_2 and one of a source and a drain of a transistor in each of the memory cells CL_1_b to CL_a_b, respectively and are connected to the output OUT via the reading circuit 10_2 and the reading circuit 10_b respectively. The word line WL_1 is connected to gates of the transistors in the memory cell CL_1_1 to CL_1_b. Similarly, the word line WL_2 and WL_a are connected to gates of the transistors in the memory cells CL_2_1 to CL_2_b and gates of the transistors in the memory cells CL_a_1 to CL_a_b, respectively.

The memory cell CL_1_1 to CL_a_b may have the same structure as the memory cell CL described in Embodiment 1.

The reading circuits 10_1 to 10_b may be for example, sense amplifiers.

The switch circuits 20_1 to 20_b may be, for example, analogue switches.

Note that one or more registers may be provided between the switch circuits 20_1 to 20_b and the memory cell CL_1_1 to CL_1_b. As described in detail later, provision of the registers allows writing column by column, which leads to increase of the writing speed.

Four data lines DL are used in this embodiment; however, the number of the data lines is not limited to four. The number may be selected suitably in accordance with the number of capacitors included in the memory cells CL_1_1 to CL_a_b.

Six address lines ADL are used in this embodiment; however, the number of the address lines is not limited to six. The number may be selected suitably in accordance with the number of the memory cells constituting a memory module.

Next, a writing method of data in the memory module in FIG. 2 is described.

Data writing is performed on every memory cell. For example, when data are written into the memory cell CL_a_b, the potential of the bit line BL_b is set at the potential VDD, and VH is applied to the word line WL_a. At this time, by applying appropriate high potentials (VH or higher, for example) to the bit lines and the data lines which are connected to memory cells not to be written, the transistors except one included in the memory cell CL_a_b. stay in off-state. Then, the switch circuit 20_b may be turned on with use of the address line ADL, by control of the potential of the data line DL. In this manner, data_CL_a_b can be written into the memory cell CL_a_b. This operation is performed on every memory cell, and thus data (data_CL_1_1 to data_CL_a_b) can be written into all memory cells.

Alternatively, data writing is performed row by row. In this case, a structure in which a register is provided between a switch circuit and a memory cell as described above may be employed. As a specific data writing method, for example, a method with which data are written collectively into the memory cells CL_a_1 to CL_a_b of the a-th row sharing the word line WL_a is described. With the address lines ADL, only the switch circuit 20_1 is turned on, and the potentials of the controlled data lines DL are held in the register. Then, with the address line ADL, only the switch circuit 20_2 is turned on, and the potentials of the controlled data lines DL are held in the register. After repetition of this step, with the address lines ADL, only the switch circuit 20_b is turned on, and the potential of the controlled data lines DL are held in the register. After that, in the state that the switch circuits 20_1 to 20_b are off, the potentials of the bit lines BL_1 to BL_b are set at the potential VDD, and VH is applied to the word line WL_a, so that the memory cells CL_a_1 to CL_a_b can be supplied with data in accordance with the potentials held in the register. This step is performed row by row, so that data can be written in the memory module including the memory cells on the a rows and the b columns.

Then, a reading method of data from the memory module in FIG. 2 is described.

Data reading is performed on every memory cell. For example, when data of the memory cell CL_a_b are read, the switch circuit 20_b is turned on with the address line ADL and the potentials of the data lines DL are all set at GND and VR is applied to the bit line BL_b. Further, by applying appropriate high potentials (VH or higher, for example) to the bit lines and the data lines which are connected to memory cells not to be read, the transistors except one included in the memory cell CL_a_b. stay in off-state. Then, when the word line WL_a is set at VH, the potential of the bit line BL_b is shifted to data_CL_a_b. The potential is read in the reading circuit 10_b. This step is performed on every memory cell, so that data of the memory module having memory cells on the a rows and the b columns can be read.

The switch circuit and the reading circuit are connected to each other, and thus the potential to turn on the switch circuit may be a reference potential of the reading circuit. With such a structure, the number of wirings can be decreased, so that the memory module can be downsized or highly integrated.

In accordance with one embodiment of the present invention, a memory module having a large capacity in which a plurality of $2^n$-level memory cells are connected can be formed.

This embodiment can be combined with any of the other embodiments as appropriate.

Embodiment 3

In this embodiment, a memory cell that is one of semiconductor memory devices will be described with reference to FIGS. 3A and 3B.

FIG. 3A is a cross-sectional view of a semiconductor memory device including a region 300 having a semiconductor substrate 331 and a first insulating film 332; a second insulating film 302 over the region 300; an island-shaped semiconductor film 306 provided over the second insulating film 302; a conductive film 308 and a conductive film 309 which are partially in contact with the semiconductor film 306; a third insulating film 312 provided over the semiconductor film 306, the conductive film 308, and the conductive film 309; a conductive film 304 overlapped with the semiconductor film 306 with the third insulating film 312 interposed therebetween; conductive films 341 to 344 formed with the same layer as the conductive film 304; and a fourth insulating film 316 provided to cover the third insulating film 312, the conductive film 304, and the conductive films 341 to 344.

As the semiconductor film 306, a highly-purified semiconductor film having a band gap of 2.5 eV or higher is used. For example, an oxide semiconductor film, a silicon carbide film, a gallium nitride film, or the like may be used.

As a material used for the oxide semiconductor film, any of the following materials may be used: a four-component metal oxide such as an In—Sn—Ga—Zn—O-based material; three-component metal oxides such as an In—Ga—Zn—O-based material, an In—Sn—Zn—O-based material, an In—Al—Zn—O-based material, a Sn—Ga—Zn—O-based material, an Al—Ga—Zn—O-based material, and a Sn—Al—Zn—O-based material; two-component metal oxides such as an In—Zn—O-based material, a Sn—Zn—O-based material, an Al—Zn—O-based material, a Zn—Mg—O-based material, a Sn—Mg—O-based material, and an In—Mg—O-based material, and an In—Ga—O-based material; an In—O-based material; a Sn—O-based material; a Zn—O-based material; and the like. In addition, any of the above materials may contain silicon oxide. Here, for example, an In—Ga—Zn—O-based material means an oxide containing indium (In), gallium (Ga), and zinc (Zn), and there is no particular limitation on the composition ratio. Further, the In—Ga—Zn—O-based material may contain an element other than In, Ga, and Zn.

In particular, In—Sn—Zn—O-based materials are preferred for high speed operation of a semiconductor memory device, because such materials can provide high field effect mobility.

As the oxide semiconductor film, a thin film formed using a material represented by the chemical formula, $InMO_3(ZnO)_m$ (m>0), may be used. Here, M represents one or more metal elements selected from the group of Ga, Al, Mn, and Co. For example, M may be Ga, Ga and Al, Ga and Mn, Ga and Co, or the like.

The oxide semiconductor film can be formed by a sputtering method, a PLD method, a spray method, or the like.

In particular, when an oxide semiconductor film with high purity and few defects is formed by a sputtering method, the partial pressure of oxygen at the film formation is preferably 10% or more. In addition, the temperature of the film formation is set in the range of 200° C. to 450° C., so that the concentration of impurities (such as hydrogen) in the film can be reduced.

Further, heat treatment is performed after the film formation, and thereby an oxide semiconductor film with higher purity and fewer defects can be formed. Specifically, the heat treatment may be performed under the conditions that the temperature is set at 150° C. or higher and lower than a strain point of the substrate, preferably from 250° C. to 450° C., the atmosphere is highly purified nitrogen, oxygen or rare gas, or a mixed atmosphere of nitrogen, oxygen and/or a rare gas, and the process time is from 6 minutes to 24 hours. The process time may be longer than 24 hours; however, if the process time is too long, the cost effectiveness becomes low. Preferably, after the heat treatment is performed under a nitrogen atmosphere, another heat treatment is performed under an oxidative atmosphere (an atmosphere including oxygen, ozone, nitrous oxide, or the like at 10 ppm or more) without changing the temperature. In this manner, purity can be heightened and oxygen deficiencies can be reduced.

Although not illustrated, the region 300 may include at least any one of circuits such as a sense amplifier circuit, a register circuit, and an analogue switch circuit, and wirings. Here, the semiconductor substrate 331 may be a substrate containing semiconductor such as a silicon wafer, a silicon carbide substrate, a gallium nitride substrate, a gallium arsenide substrate, a germanium substrate, or an SOI (Silicon On Insulator) substrate. In addition, the first insulating film 332 is provided to separate such circuits and wirings from the memory cell, or the second insulating film 302 may also have the function of the first insulating film 332. The surface of the region 300 may be planarized by chemical mechanical polishing (CMP) or the like.

The transistor Tr includes the second insulating film 302 as a base insulating film; the semiconductor film 306 as an active layer; the conductive film 308 and the conductive film 309 as a source electrode and a drain electrode; the conductive film 304 as a gate electrode; and the third insulating film 312 as a gate insulating film. Note that the transistor Tr may have any structure as appropriate without being limited to the structure illustrated in FIGS. 3A and 3B.

The second insulating film 302 may be a single layer or a stacked layer of a silicon oxide film, a silicon oxynitride film, a silicon nitride oxide film, a silicon nitride film, an aluminum oxide film, and/or the like. Since the second insulating film 302 serves as the base insulating film of the transistor Tr, it is preferably an insulating film from which oxygen is released by heating.

The phrase "oxygen is released by heating" means that the amount of released oxygen which is converted into oxygen atoms is $1.0 \times 10^{18}$ atoms/cm$^3$ or higher, preferably $3.0 \times 10^{20}$ atoms/cm$^3$ or higher in thermal desorption spectroscopy (TDS).

Here, a method in which the amount of released oxygen is measured by being converted into oxygen atoms using TDS analysis will now be described.

The amount of released gas in TDS analysis is proportional to the integral value of a spectrum. Therefore, the amount of released gas can be calculated from the ratio between the integral value of a spectrum of an insulating film and the reference value obtained from a standard sample. The reference value of a standard sample refers to the ratio of the density of atoms of a predetermined element contained in the sample to the integral value of its spectrum.

For example, the number of the released oxygen molecules ($N_{O2}$) from an insulating film can be found based on Equation 3 with the TDS analysis results of a silicon wafer containing hydrogen at a predetermined density which is the standard sample and the TDS analysis results of the insulating film. Here, all spectra having a mass number of 32 which are obtained by the TDS analysis are assumed to originate from an oxygen molecule. $CH_3OH$, which is given as a gas having a mass number of 32, is not taken into consideration on the assumption that it is unlikely to be present. Further, an oxygen molecule including an oxygen atom having a mass number of 17 or 18 which is an isotope of an oxygen atom is also not taken into consideration because the proportion of such a molecule in the natural world is minimal.

$$N_{O2} = N_{H2}/S_{H2} \times S_{O2} \times \alpha \qquad \text{(Equation 3)}$$

$N_{H2}$ is the value obtained by conversion of the number of hydrogen molecules desorbed from the standard sample into densities. $S_{H2}$ is the integral value of a spectrum when the standard sample is subjected to TDS analysis. Here, the reference value of the standard sample is set to $N_{H2}/S_{H2}$. $S_{O2}$ is the integral value of a spectrum when the insulating film is subjected to TDS analysis. α is a coefficient influencing the intensity of the spectrum in the TDS analysis. For details of the Equation 3, Japanese Published Patent Application No. H6-275697 is referred to. Note that the amount of released oxygen from the insulating film is measured with a thermal desorption spectroscopy apparatus produced by ESCO Ltd., EMD-WA1000S/W using a silicon wafer containing hydrogen atoms at $1\times10^{16}$ atoms/cm$^3$ as the standard sample.

Further, in the TDS analysis, oxygen is partly detected as an oxygen atom. The ratio between oxygen molecules and oxygen atoms can be calculated from the ionization rate of the oxygen molecules. Note that, since the above α includes the ionization rate of the oxygen molecules, the number of the released oxygen atoms can also be estimated through the evaluation of the amount of the released oxygen molecules.

Note that $N_{O2}$ is the amount of the released oxygen molecules. For the insulating film, the amount of released oxygen when converted into oxygen atoms is twice the amount of the released oxygen molecules.

In the above structure, the insulating film from which oxygen is released by heating may be oxygen-excess silicon oxide ($SiO_x$ (X>2)). In the oxygen-excess silicon oxide ($SiO_x$ (X>2)), the number of oxygen atoms per unit volume is more than twice the number of silicon atoms per unit volume. The number of silicon atoms and the number of oxygen atoms per unit volume are measured by Rutherford backscattering spectrometry.

By supplying oxygen from the base insulating film to the oxide semiconductor region, the density of an interface state between the base insulating film and the oxide semiconductor region can be reduced. As a result, electric charges or the like which may be produced due to an operation of a transistor can be inhibited from being captured at the interface between the base insulating film and the oxide semiconductor region, and thereby a transistor with less degradation in electric characteristics can be provided.

Further, charges are caused due to oxygen deficiency in the oxygen semiconductor region in some cases. In general, a part of oxygen deficiencies in an oxide semiconductor region serves as a donor to generate an electron that is a carrier. As a result, the threshold voltage of a transistor is shifted negatively. This tendency occurs remarkably in oxygen deficiencies caused on the back channel side. Note that the term "back channel" in this specification refers to the vicinity of an interface on the base insulating film side of the oxide semiconductor region. Oxygen is sufficiently supplied from the base insulating film to the oxide semiconductor region, whereby oxygen deficiencies in the oxide semiconductor region which causes the negative shift of the threshold voltage can be reduced.

In other words, when oxygen deficiencies are caused in the oxide semiconductor region, it is difficult to inhibit trapping of a charge at an interface between the base insulating film and the oxide semiconductor region. However, by providing an insulating layer from which oxygen is released by heating as the base insulating film, the interface state between the oxide semiconductor region and the base insulating film and the oxygen deficiencies in the oxide semiconductor region can be reduced and the influence of the trapping of a charge at the interface between the oxide semiconductor region and the base insulating film can be made small.

Examples of materials used for the conductive film 308 and the conductive film 309 include metals, alloys, or metal nitrides of the following elements: aluminum, titanium, chromium, nickel, copper, yttrium, zirconium, molybdenum, silver, tantalum, and tungsten. Further, a transparent conductive material including indium oxide, tin oxide, or zinc oxide may be used. Further, a stacked-layer structure of such materials may be employed.

In addition, the conductive film 309 serves as one electrode of each of the capacitors C__1 to C__4.

The third insulating film 312 may be, for example, formed with a stacked layer or a single layer using silicon oxide, silicon oxynitride, silicon nitride oxide, silicon nitride, aluminum oxide, hafnium oxide, Yttria-stabilized zirconia, and/or the like. For example, the third insulating film 312 may be formed by a thermal oxidation method, a CVD method, a sputtering method, or the like. As the third insulating film 312, an insulating film from which oxygen is released by heating may be used. With use of such an insulating film from which oxygen is released by heating for the third insulating film 312, defects generated in the semiconductor film 306 can be repaired and electric characteristics of the transistor can be inhibited from being degraded.

In addition, the third insulating film 312 serves as a capacitor insulating film of each of the capacitors C__1 to C__4.

The materials used for the conductive film 304 and the conductive films 341 to 344 may be similar to those of the conductive film 308 and the conductive film 309.

The conductive films 341 to 344 serve as the other electrode of each of the capacitors C__1 to C__4. In other words, the capacitances of the capacitors C__1 to C__4 are determined depending on the material and the thickness of the third insulating film 312, and the areas of the conductive films 341 to 344.

The fourth insulating film 316 may be, for example, formed with a stacked-layer or a single layer using silicon oxide, silicon oxynitride, silicon nitride oxide, silicon nitride, or the like. For example, the fourth insulating film 316 may be formed by a thermal oxidation method, a CVD method, a sputtering method, or the like. Further, an organic material such as polyimide or acrylic may be used.

FIG. 3B is a top view of the memory cell illustrated in FIG. 3A. Note that the other components than the conductive film 308, the conductive film 309, the conductive film 304, and the conductive films 341 to 344 are omitted for simplification.

The conductive film 308 serves as the bit line BL, the conductive film 304 serves as the word line WL, and the conductive films 341 to 344 serve as the data line DL__1 to DL__4.

Since, in accordance with this embodiment, the off-state current of the transistor Tr is small, the storage capacitances of the capacitors can be reduced. In addition, the change of the potentials held in the memory cell is minute, and thus a slight difference between the potentials can be read, and thus a multilevel memory cell can be formed.

Note that, in this embodiment, the memory cell includes four capacitors and four data lines; however the numbers of the capacitors and data lines are each not limited to four, and can be selected as appropriate depending on the storage capacity needed.

This embodiment can be combined with any of the other embodiments as appropriate.

Embodiment 4

In this embodiment, a memory cell having an area reduced due to a stacked structure, which is different from the memory cell in Embodiment 3, will be described.

Figure 4A:
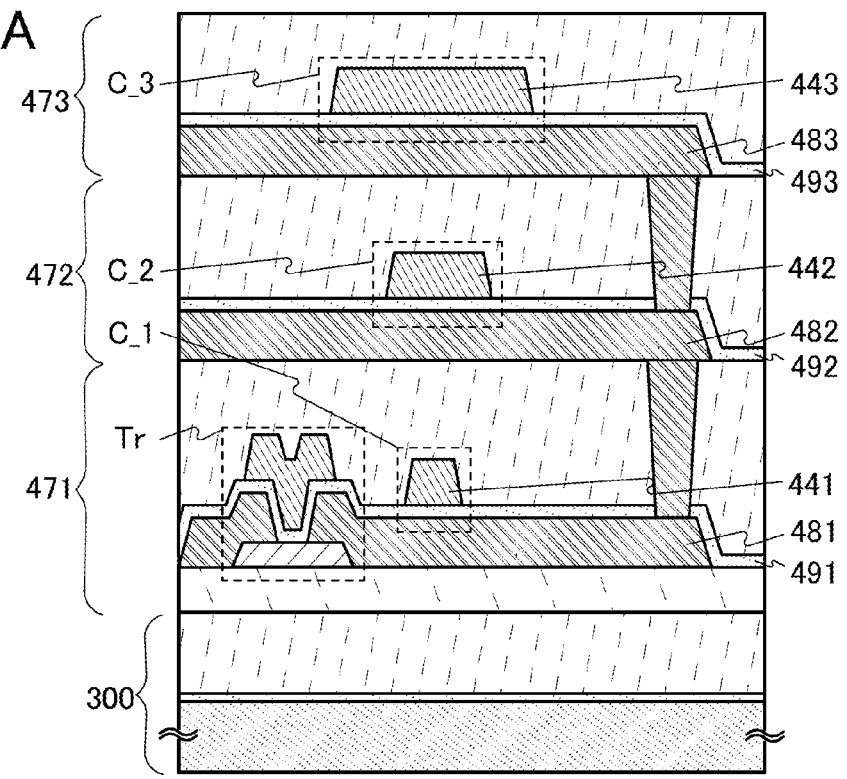
FIG. 4A is a cross-sectional view and FIGS. 4B to 4D are top views of a memory cell in a semiconductor memory device.

FIG. 4A is a cross-sectional view of the memory cell. In this embodiment, the memory cell includes the region 300, a region 471 above the region 300, a region 472 above the region 471, and a region 473 above the region 472.

The region 471 includes the transistor Tr and the capacitor C_1, the region 472 includes the capacitor C_2, and the region 473 includes the capacitor C_3. Note that the capacitors C_1, C_2, and C_3 include conductive films 441, 442, and 443, insulating films 491, 492, and 493, and conductive films 481, 482, and 483, respectively as their components. The insulating films 491 to 493 may be formed from different materials and with different thicknesses so that the capacitances of the capacitors C_1 to C_3 can be controlled. The conductive films 481 to 483 are connected to each other through contact holes.

The surfaces of the region 300 and the regions 471 to 473 may be planarized by CMP or the like. The planarization of the surface of each region can decrease adverse effect of steps in each region.

Figure 4B:
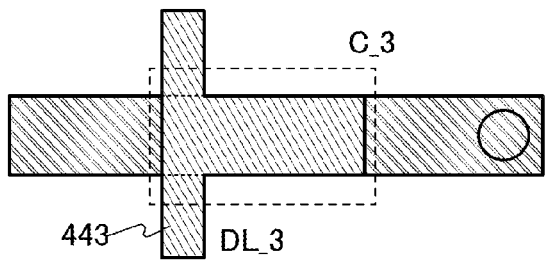
Figure 4C:
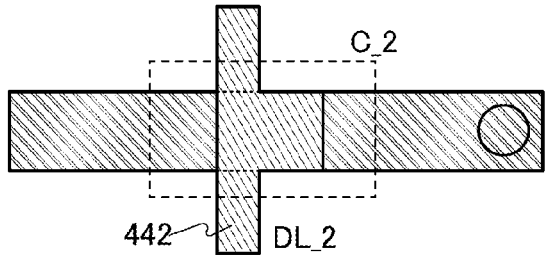
Figure 4D:
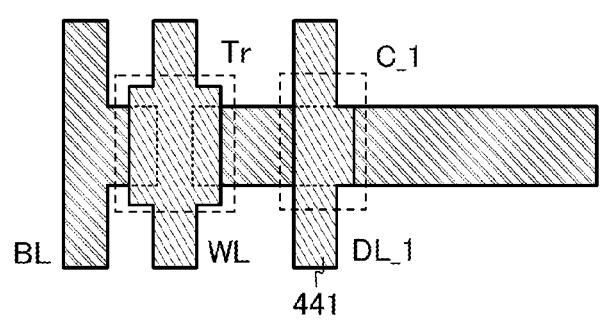

FIG. 4B, FIG. 4C, and FIG. 4D are top views of the region 473, the region 472, and the region 471, respectively, which are seen from above.

In this embodiment, the regions having the capacitors are stacked to form a three-layer structure; however, the regions having the capacitors may be stacked to form a structure with four layers or more layers.

With such a structure, the area of the memory cell can be reduced.

This embodiment can be combined with any of the other embodiments as appropriate.

Embodiment 5

In this embodiment, a memory cell having an area which is more reduced due to a stacked structure of capacitors and provision of a plurality of capacitors in one layer, which is different from the memory cells in Embodiments 3 and 4, will be described.

Figure 5A:
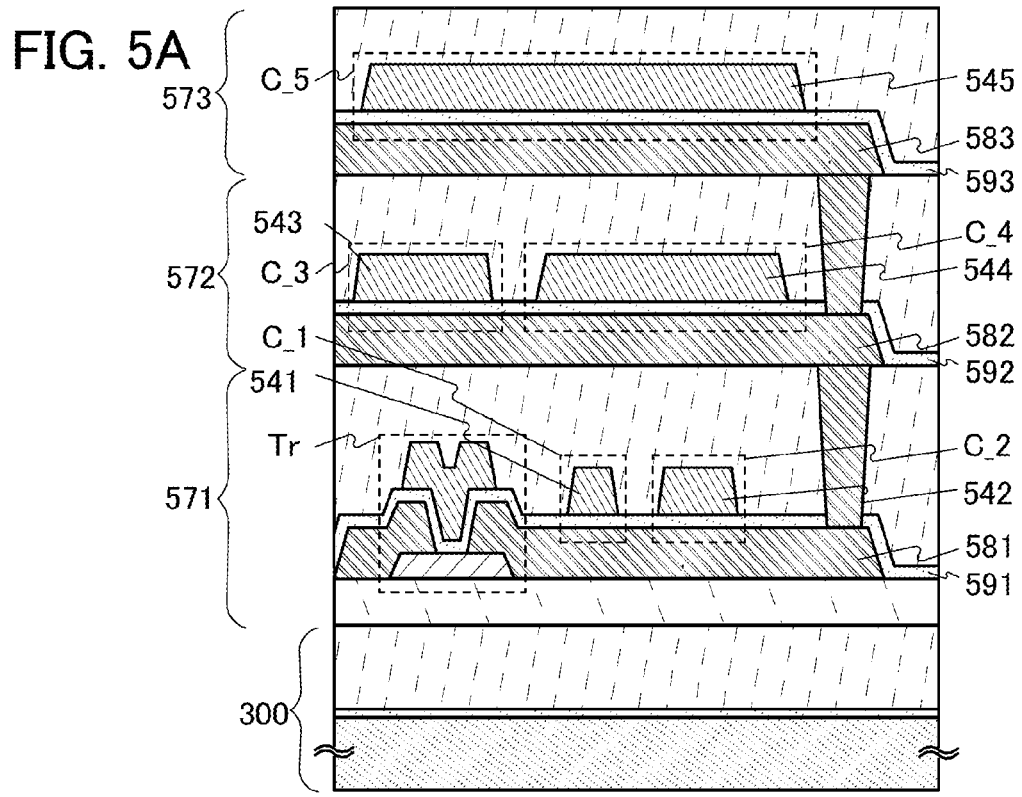
FIG. 5A is a cross-sectional view and FIGS. 5B to 5D are top views of a memory cell in a semiconductor memory device.

FIG. 5A is a cross-sectional view of the memory cell. In this embodiment, the memory cell includes the region 300, a region 571 above the region 300, a region 572 above the region 571, and a region 573 above the region 572.

The region 571 includes the transistor Tr and the capacitors C_1 and C_2, the region 572 includes the capacitors C_3 and C_4, and the region 573 includes the capacitor C_5. Note that the capacitors C_1 and C_2 include conductive films 541 and 542, an insulating film 591, and a conductive film 581 as their components; the capacitors C_3 and C_4 include conductive films 543 and 544, an insulating film 592, and a conductive film 582 as their components; the capacitor CS includes a conductive film 545, an insulating film 593, and a conductive film 583 as its components. The insulating films 591 to 593 may be formed from different materials and with different thicknesses so that the capacitances of the capacitors C_1 to C_5 can be controlled. The conductive films 581 to 583 are connected to each other through contact holes.

The surfaces of the region 300 and the regions 571 to 573 may be planarized by CMP or the like.

Figure 5B:
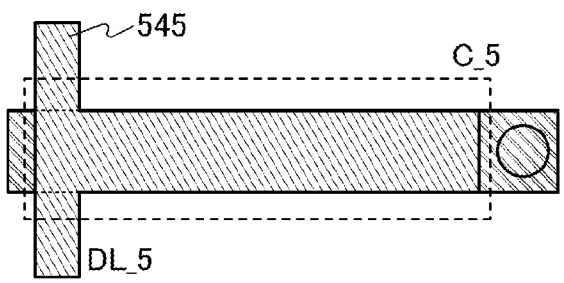
Figure 5C:
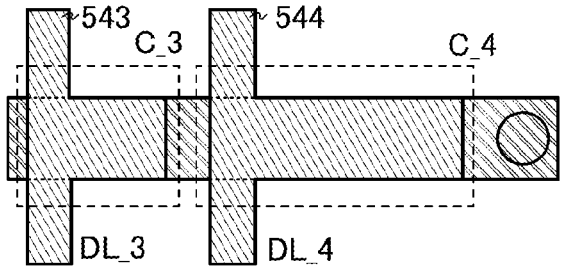
Figure 5D:
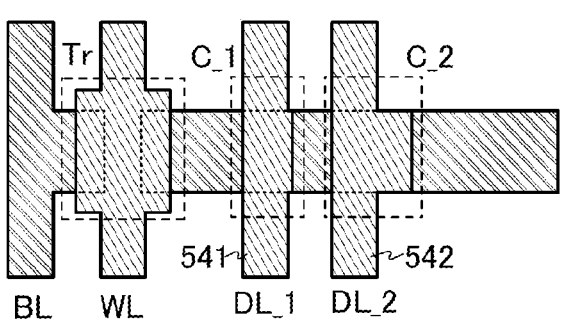

FIG. 5B, FIG. 5C, and FIG. 5D are top views of the region 573, the region 572, and the region 571, respectively, which are seen from above.

In this embodiment, the regions having the capacitors are stacked to form a three-layer structure; however, the regions having the capacitors may be stacked to form a structure with four layers or more layers, without being limited to the three-layer structure.

The structure in this embodiment where one region includes a plurality of capacitors makes it possible to provide a memory cell storing more levels of data in the same area, as compared with the structure in Embodiment 4. In other words, the area of the memory cell per unit area can be more reduced.

This embodiment can be combined with any of the other embodiments as appropriate.

Embodiment 6

In this embodiment, a memory cell having a much more reduced area, which is a different one from the semiconductor memory devices in Embodiments 3 to 5, will be described. In the memory cell, a region 600 includes a step portion and a capacitor is embedded in the step portion, so that the area of the memory cell is reduced. The structure of this embodiment is a so-called trench structure and a capacitor with a small area and a large capacity can be formed.

Figure 6A:
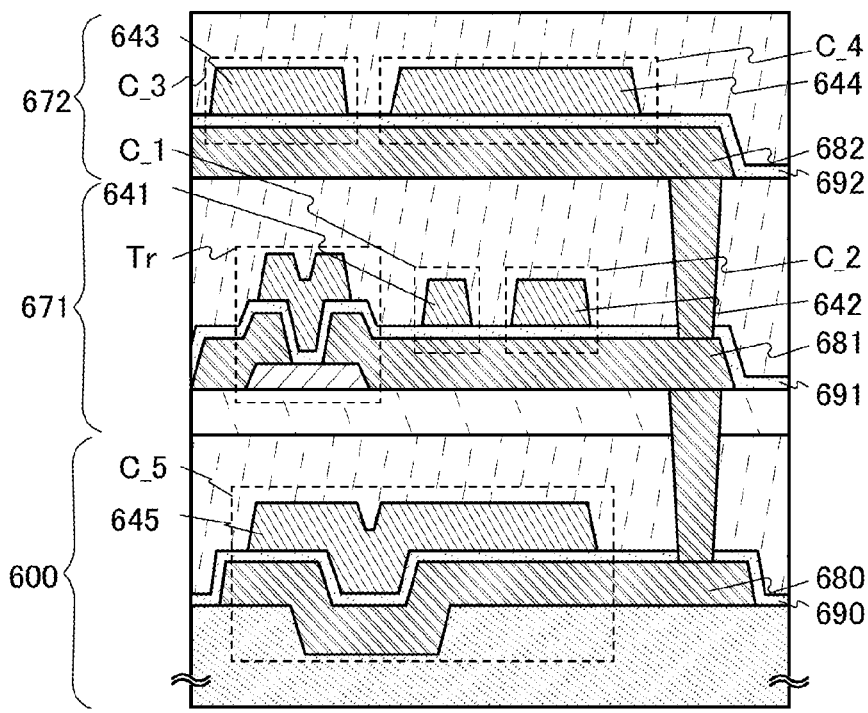
FIG. 6A is a cross-sectional view and FIGS. 6B to 6D are top views of a memory cell in a semiconductor memory device.

FIG. 6A is a cross-sectional view of the memory cell. In this embodiment, the memory cell includes the region 600, a region 671 above the region 600, and a region 672 above the region 671.

The region 600 has a structure similar to that of the region 300, except that the region 600 includes the step portion and the capacitor. The capacitor CS includes an insulating film 690, a conductive film 680, and a conductive film 645 as its components.

The region 671 includes the transistor Tr and the capacitors C_1 and C_2, the region 672 includes the capacitors C_3 and C_4, and the region 600 includes the capacitor C_5. Note that the capacitors C_1 and C_2 include conductive films 641 and 642, an insulating film 691, and a conductive film 681 as their components; the capacitors C_3 and C_4 include conductive films 643 and 644, an insulating film 692, and a conductive film 682 as their components; and the capacitor CS includes a conductive film 645, an insulating film 690, and a conductive film 680 as its components. The insulating films 690 to 692 may be formed from different materials and with different thicknesses so that the capacitances of the capacitors C_1 to C_5 can be controlled. The conductive films 680 to 682 are connected to each other through contact holes.

The surfaces of the region 600 and the regions 671 and 672 may be planarized by CMP or the like.

Figure 6B:
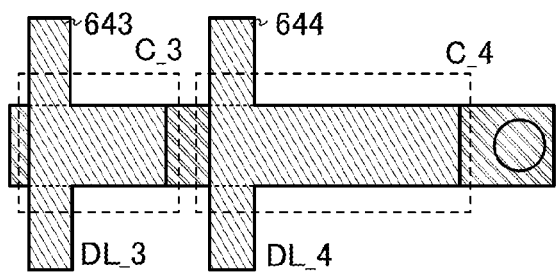
Figure 6C:
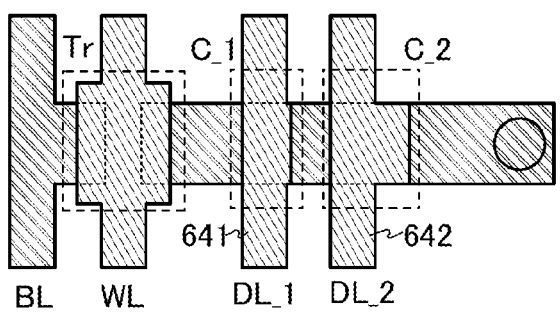
Figure 6D:
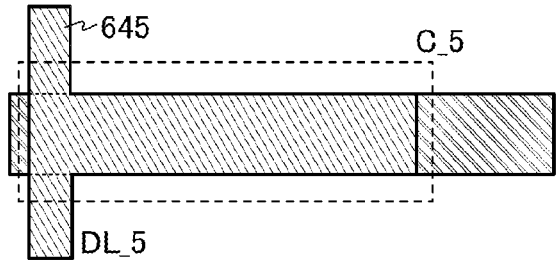

FIG. 6B, FIG. 6C, and FIG. 6D are top views of the region 672, the region 671, and the region 600, respectively, which are seen from above.

In this embodiment, the regions having the capacitors are stacked to form a three-layer structure; however, the regions having the capacitors may be stacked to form a structure with four layers or more layers without being limited to the three-layer structure.

Since the region 600 includes the step portion and the capacitor is provided in the step portion, the area occupied with the capacitor in the memory cell can be reduced, whereby the area of the memory cell can be much more reduced than those in Embodiments 4 and 5.

This embodiment can be combined with any of the other embodiments as appropriate.

Embodiment 7

In this embodiment, a semiconductor memory device having a small area will be described, which is another embodiment of a semiconductor memory device having the trench structure as described in Embodiment 6. In the semiconductor memory device, a region 700 includes a step portion and the capacitor is formed over the step portion as illustrated in FIG. 7A.

Figure 7A:
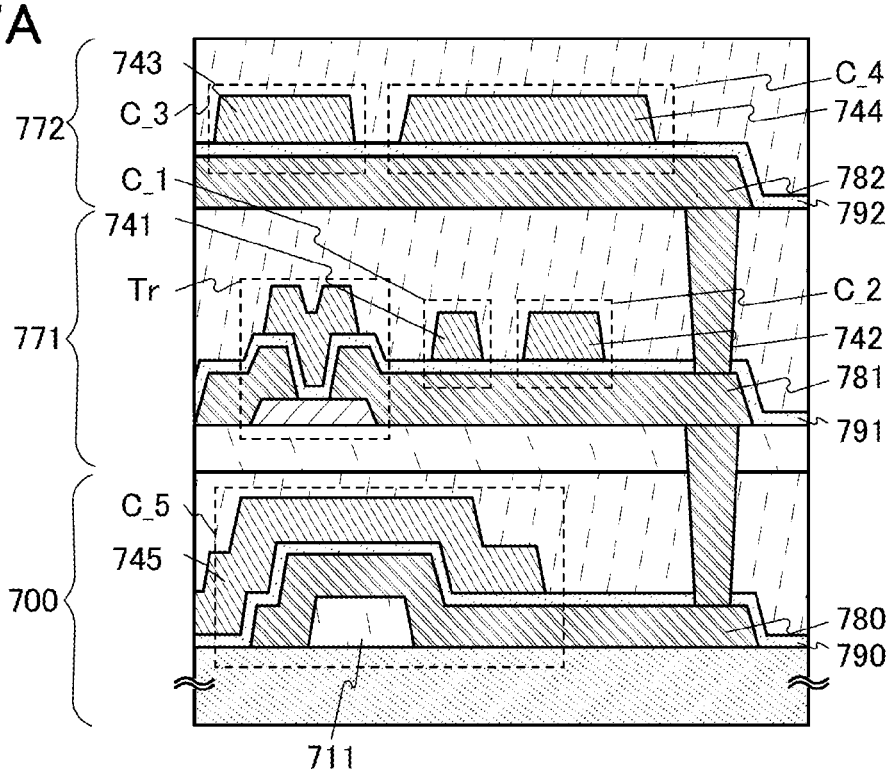
FIG. 7A is a cross-sectional view and FIGS. 7B to 7D are top views of a memory cell in a semiconductor memory device.

FIG. 7A is a cross-sectional view of the memory cell. In this embodiment, the memory cell includes the region 700, a region 771 above the region 700, and a region 772 above the region 771.

The region 700 has a structure similar to that of the region 300, except that the region 700 includes the step portion 711 and the capacitor. The capacitor C_5 includes an insulating film 790, a conductive film 780 and a conductive film 745 as its components.

The region 771 includes the transistor Tr and the capacitors C_1 and C_2, the region 772 includes the capacitors C_3 and C_4, and the region 700 includes the capacitor C_5. Note that the capacitors C_1 and C_2 include conductive films 741 and 742, an insulating film 791, and a conductive film 781 as their components; the capacitors C_3 and C_4 include conductive films 743 and 744, an insulating film 792, and a conductive film 782 as their components; and the capacitor C_5 includes a conductive film 745, an insulating film 790, and a conductive film 780 as its components. The insulating films 790 to 792 may be formed from different materials and with different thicknesses so that the capacitances of the capacitors C_1 to C_5 can be controlled. The conductive films 780 to 782 are connected to each other through contact holes.

The surfaces of the region 700 and the regions 771 and 772 may be planarized by CMP or the like.

Figure 7B:
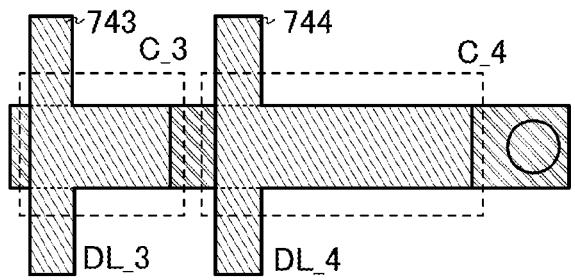
Figure 7C:
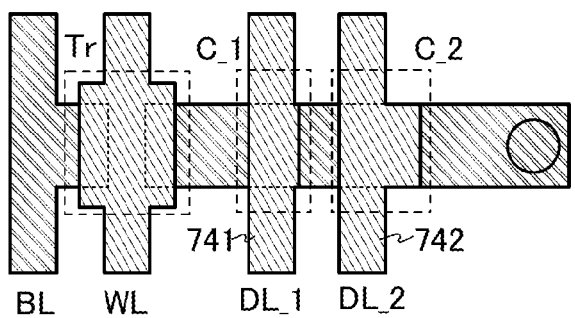
Figure 7D:
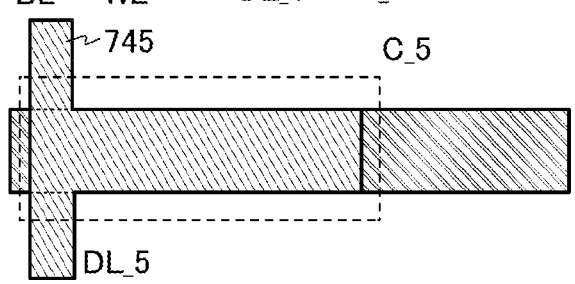
Figure 8A:
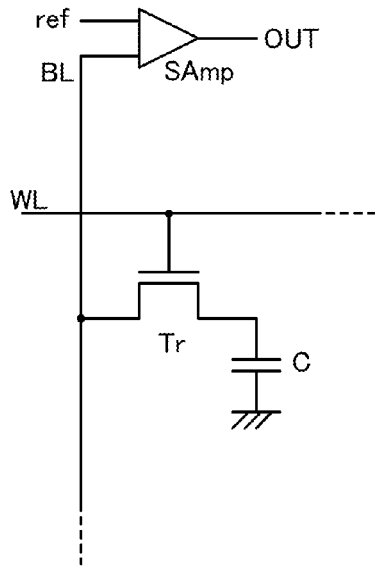
FIGS. 8A to 8C are diagrams for explaining a conventional semiconductor memory device.
Figure 8B:
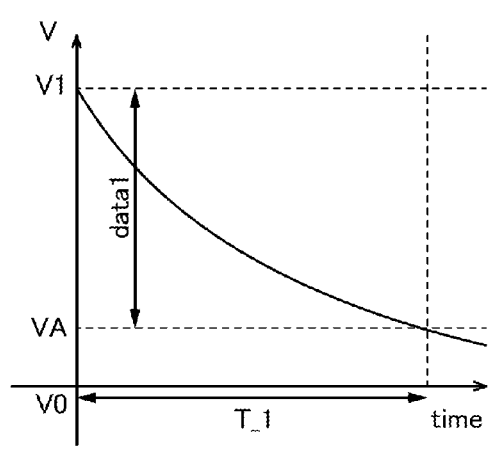
Figure 8C:
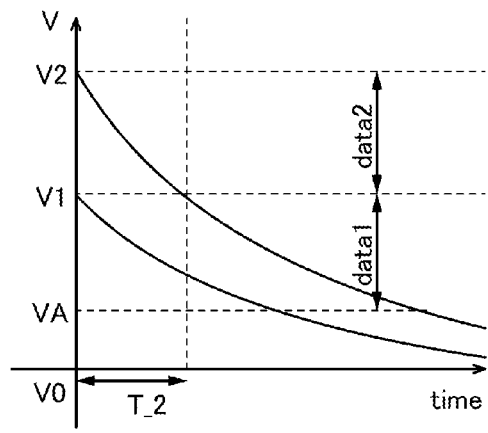

FIG. 7B, FIG. 7C, and FIG. 7D are top views of the region 772, the region 771, and the region 700, respectively, which are seen from above.

In this embodiment, the regions having the capacitors are stacked to form a three-layer structure; however, the regions having the capacitors may be stacked to form a structure with four layers or more layers without being limited to the three-layer structure.

Since the region 700 includes the step portion and the capacitor is provided in the step portion, the area occupied with the capacitor in the memory cell can be reduced, whereby the area of the memory cell can be much more reduced than those in Embodiments 4 and 5.

This embodiment can be combined with any of the other embodiments as appropriate. This application is based on Japanese Patent Application serial No. 2010-261470 filed with the Japan Patent Office on Nov. 24, 2010, the entire contents of which are hereby incorporated by reference.

What is claimed is:

1. A semiconductor device comprising:
a bit line;
a word line;
a first data line;
a first electrode;
a first insulating film between the first electrode and the first data line;
a second data line;
a second electrode;
a second insulating film between the second electrode and the second data line a third insulating film between the first data line and the second electrode; and
a transistor having a channel in an oxide semiconductor film,
wherein one of a source and a drain of the transistor is electrically connected to the bit line,
wherein the other of the source and the drain of the transistor is electrically connected to the first electrode and the second electrode,
wherein a gate of the transistor is electrically connected to the word line,
and
wherein the first electrode is provided over a step portion.

2. The semiconductor device according to claim 1, wherein a capacitance between the first electrode and the first data line and a capacitance between the second electrode and the second data line are different.

3. The semiconductor device according to claim 1, wherein a capacitance between the second electrode and the second data line is from 0.1 fF to 1 fF, inclusive.

4. The semiconductor device according to claim 1,
wherein an insulating layer is provided over the first data line, and
wherein the second electrode is provided over the insulating layer.

5. The semiconductor device according to claim 1, wherein the step portion is a concave portion.

6. The semiconductor device according to claim 1, wherein the step portion is a convex portion.

7. A semiconductor device comprising:
a bit line;
a word line;
a first insulating film over a first electrode;
a first data line over the first insulating film;
a second insulating film over a second electrode over the first data line;
a second data line over the second insulating film; and
a transistor,
wherein one of a source and a drain of the transistor is electrically connected to the bit line,
wherein the other of the source and the drain of the transistor is electrically connected to the first electrode and the second electrode,
wherein the first insulating film is provided over the first electrode,
wherein the second insulating film is provided over the second electrode,
wherein a gate of the transistor is electrically connected to the word line,
wherein a first capacitance between the first electrode and the first data line is different from a second capacitance between the second electrode and the second data line,
wherein a third insulating film is provided between the first electrode and the second electrode, and
wherein the first electrode is provided over a step portion.

8. The semiconductor device according to claim 7, wherein the first capacitance is larger than the second capacitance.

9. The semiconductor device according to claim 7, wherein the second capacitance is from 0.1 fF to 1 fF, inclusive.

10. The semiconductor device according to claim 7, wherein the step portion is a concave portion.

11. The semiconductor device according to claim 7, wherein the step portion is a convex portion.

12. The semiconductor device according to claim 7, wherein the transistor has a channel in an oxide semiconductor film.

13. A semiconductor device comprising:
a bit line;
a word line;
a first insulating film over a first electrode;
a first data line over the first insulating film;
a second insulating film over a second electrode over the first data line;
a second data line over the second insulating film;

a third insulating film between the first data line and the second electrode; and a semiconductor layer, wherein the bit line is electrically connected to the semiconductor layer, wherein the second insulating film covers the semiconductor layer, wherein the first electrode and the second electrode is electrically connected to the semiconductor layer, and wherein the word line is overlapping the semiconductor layer interposed with the second insulating film therebetween, and wherein the first electrode is provided over a step portion.

14. The semiconductor device according to claim 13, wherein a first capacitance between the first data line and the first electrode is larger than a second capacitance between the second data line and the second electrode.

15. The semiconductor device according to claim 14, wherein the second capacitance is from 0.1 fF to 1 fF, inclusive.

16. The semiconductor device according to claim 13, wherein the second electrode is electrically connected to the first electrode via a contact hole.

17. The semiconductor device according to claim 13, wherein the step portion is a concave portion.

18. The semiconductor device according to claim 13, wherein the step portion is a convex portion.

19. The semiconductor device according to claim 13, wherein the semiconductor layer comprises an oxide semiconductor.

20. The semiconductor device according to claim 1, wherein the insulating film works as a gate insulating film of the transistor.

* * * * *